United States Patent
Yoo et al.

(10) Patent No.: US 10,219,380 B2
(45) Date of Patent: Feb. 26, 2019

(54) ELECTRONIC DEVICE MODULE AND MANUFACTURING METHOD THEREOF

(71) Applicant: SAMSUNG ELECTRO-MECHANICS CO., LTD., Suwon-Si, Gyeonggi-Do (KR)

(72) Inventors: Do Jae Yoo, Suwon-Si (KR); Jae Hyun Lim, Suwon-Si (KR); Kyu Hwan Oh, Suwon-Si (KR); Jong In Ryu, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 235 days.

(21) Appl. No.: 14/676,745

(22) Filed: Apr. 1, 2015

(65) Prior Publication Data
US 2015/0289392 A1    Oct. 8, 2015

(30) Foreign Application Priority Data

Apr. 8, 2014 (KR) .................. 10-2014-0041668

(51) Int. Cl.
*H05K 1/18* (2006.01)
*H05K 3/40* (2006.01)
(Continued)

(52) U.S. Cl.
CPC .......... *H05K 1/181* (2013.01); *H05K 3/4007* (2013.01); *H01L 2224/16225* (2013.01); *H01L 2224/48091* (2013.01); *H01L 2224/48227* (2013.01); *H01L 2924/181* (2013.01); *H01L 2924/19105* (2013.01); *H01L 2924/19106* (2013.01); *H05K 1/111* (2013.01); *H05K 3/28* (2013.01); *H05K 3/3436* (2013.01); *H05K 2201/09436* (2013.01); *H05K 2201/09827* (2013.01);
(Continued)

(58) Field of Classification Search
None
See application file for complete search history.

(56) References Cited

U.S. PATENT DOCUMENTS

| 7,827,681 | B2 | 11/2010 | Kurashima et al. |
| 8,139,368 | B2 * | 3/2012 | Nomura ............. H01L 23/3677 174/260 |

(Continued)

FOREIGN PATENT DOCUMENTS

| JP | 2008-311520 A | 12/2008 |
| JP | 4329884 B2 | 9/2009 |

(Continued)

OTHER PUBLICATIONS

Korean Office Action dated Dec. 18, 2018 in corresponding Korean Patent Application No. 10-2014-0041668 (12 pages in English, 9 pages in Korean).

*Primary Examiner* — Courtney Smith
*Assistant Examiner* — Jessey R Ervin
(74) *Attorney, Agent, or Firm* — NSIP Law

(57) ABSTRACT

An electronic device module includes a board including external connecting electrodes and mounting electrodes; an electronic device mounted on the mounting electrodes; a molded portion sealing the electronic device; connection conductors having an end bonded to the external connecting electrodes and penetrating through the molded portion; and external terminals bonded to another end of the connection conductors.

17 Claims, 8 Drawing Sheets

(51) Int. Cl.
   *H05K 1/11*    (2006.01)
   *H05K 3/28*    (2006.01)
   *H05K 3/34*    (2006.01)

(52) U.S. Cl.
   CPC .............. *H05K 2201/09845* (2013.01); *H05K 2201/09854* (2013.01); *H05K 2201/2072* (2013.01)

(56) References Cited

U.S. PATENT DOCUMENTS

| | | | |
|---|---|---|---|
| 2003/0155656 A1* | 8/2003 | Chiu | H01L 23/49827 257/774 |
| 2007/0026196 A1* | 2/2007 | Ogawa | H01L 21/4857 428/157 |
| 2008/0307642 A1* | 12/2008 | Kurashima | H01L 21/565 29/832 |
| 2010/0101836 A1* | 4/2010 | Sekimoto | H05K 1/187 174/251 |
| 2010/0220448 A1 | 9/2010 | Nomura | |
| 2012/0145445 A1 | 6/2012 | Arai et al. | |
| 2012/0304458 A1 | 12/2012 | Yamauchi et al. | |

FOREIGN PATENT DOCUMENTS

| | | |
|---|---|---|
| JP | 4840508 B2 | 12/2011 |
| JP | 2012-195581 A | 10/2012 |
| JP | 2013-187458 A | 9/2013 |
| KR | 10-2012-0031307 A | 4/2012 |

* cited by examiner

ELECTRONIC DEVICE MODULE AND MANUFACTURING METHOD THEREOF

CROSS-REFERENCE TO RELATED APPLICATION

This application claims the benefit of Korean Patent Application No. 10-2014-0041668 filed on Apr. 8, 2014, in the Korean Intellectual Property Office, the entire disclosure of which is incorporated herein by reference for all purposes.

BACKGROUND

1. Field

The following description relates to an electronic device module including external terminals disposed outwardly of a molded portion, and a manufacturing method thereof.

2. Description of Related Art

In order to achieve miniaturization and lightness in electronic devices, system on chip (SOC) technology of implementing a plurality of individual devices in a single chip, a system in package (SIP) technology of integrating a plurality of individual devices in a single package, or the like, as well as a technology of decreasing individual sizes of mounted components are required.

In addition, in order to manufacture an electronic device module having a small size and high performance, a structure in which electronic components are mounted on both surfaces of a board and a structure in which external terminals are formed on both surfaces of a package have been developed.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

An embodiment provides an electronic device module having external terminals formed on a molded portion thereof, and a manufacturing method thereof.

According to an embodiment an electronic device module includes aboard including external connecting electrodes and mounting electrodes; an electronic device mounted on the mounting electrodes; a molded portion sealing the electronic device; connection conductors having an end bonded to the external connecting electrodes, and penetrating through the molded portion; and external terminals bonded to another end of the connection conductors.

The board further includes an insulating layer disposed on at least one surface thereof, the insulating layer contacting the connection conductors.

The insulating layer is partially interposed between the external connecting electrodes and the connection conductors.

The connection conductors are in a shape in which a cross-sectional area thereof decreases as the connection conductors approach the external connecting electrode.

The connection conductors include a first inclined section and a second inclined section, wherein the first inclined section comprises a cross sectional area smaller than a cross sectional area of the second inclined section.

The first inclined section is disposed at a portion close to the external connecting electrodes, and the second inclined section is disposed at a portion close to the external terminals.

The connection conductors include at least one step.

The other end of the connection conductors is disposed in the molded portion, and the external terminals are partially filled in the molded portion to bond to the connection conductors.

The molded portion includes an epoxy molding compound (EMC).

The connection conductors are disposed in the molded portion.

According to an example, a manufacturing method of an electronic device module, includes: preparing a board including external connecting electrodes and mounting electrodes; mounting an electronic device on the mounting electrodes; forming a molded portion by sealing the electronic device; forming via holes in the molded portion to expose the external connecting electrodes; and forming connection conductors by filling the via holes with conductive materials.

The forming of the molded portion includes forming the molded portion on both surfaces of the board.

The preparing of the board includes forming an insulating layer covering the external connecting electrodes on the board.

The forming of the via holes includes removing the molded portion and the insulating layer using a laser drill.

The forming of the via holes includes removing the insulating layer so that the insulating layer partially covers the external connecting electrodes in the via holes.

The forming of the via holes includes forming a horizontal extension surface by a step in one of the via holes.

After the forming of the connection conductors, bonding external terminals to the connection conductors.

The bonding of the external terminals includes bonding the external terminals to the connection conductor within the via holes.

According to an example, an electronic device module includes a board comprising electrodes and an insulating layer disposed on a surface thereof; a molded portion sealing the surface of the board; and connection conductors bonded to the electrodes while penetrating through the molded portion and the insulating layer, and configured to contact the molded portion and the insulating layer.

The insulating layer partially covers the electrodes.

According to another example, an electronic device module includes a board including external connecting electrodes and mounting electrodes; an electronic device mounted on the mounting electrodes; an insulating layer sealing the board; and connection conductors disposed within the insulating layer and extending from an outside of the electronic device module to the external connection electrodes.

The insulating layer partially covers the electrodes.

The connection conductors include a first inclined section and a second inclined section, wherein the first inclined section comprises a cross sectional area smaller than a cross sectional area of the second inclined section.

Other features and aspects will be apparent from the following detailed description, the drawings, and the claims.

Figure 1:
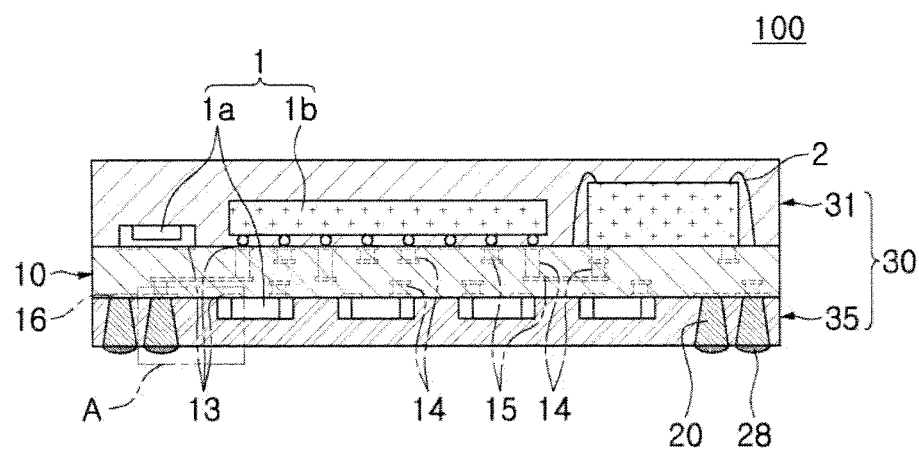
FIG. 1 is a cross-sectional view schematically illustrating an example of an electronic device module.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of and/or operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the drawings, the shapes and dimensions of elements may be exaggerated for clarity, and the same reference numerals will be used throughout to designate the same or like elements.

Figure 2:
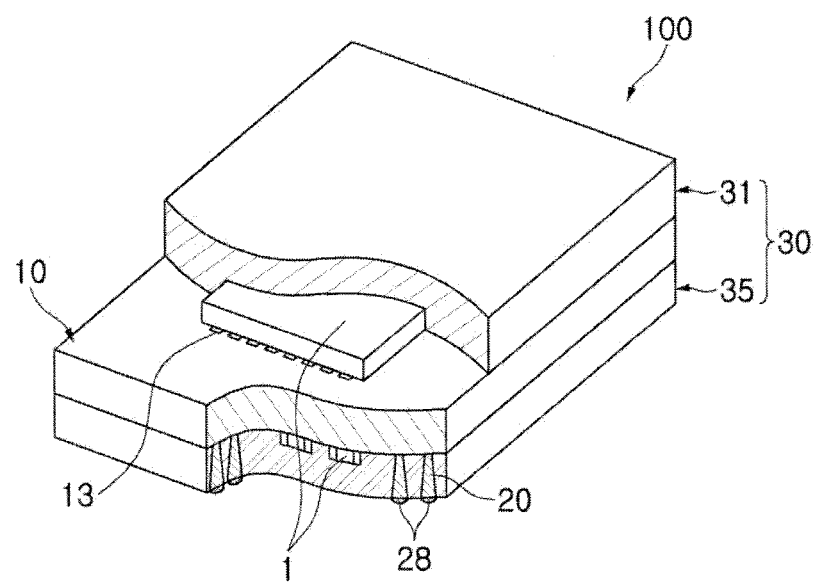
FIG. 2 is a partially cut-away perspective view illustrating an example of an inner portion of the electronic device module shown in FIG. 1

FIG. 1 is a cross-sectional view schematically illustrating an example of an electronic device module. FIG. 2 is a partially cut-away perspective view illustrating an example of an inner portion of the electronic device module shown in FIG. 1; and FIG. 3 is a partially enlarged cross-sectional view illustrating an example of part A of FIG. 1.

Figure 3:
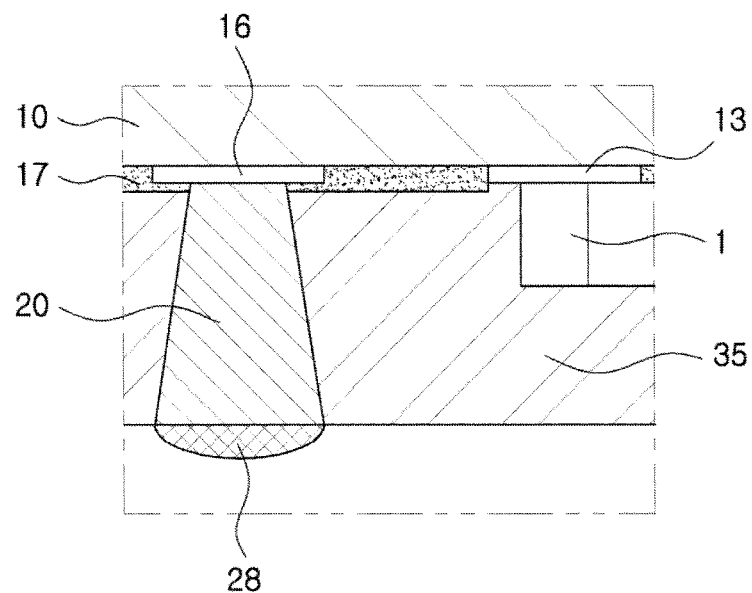
FIG. 3 is a partially enlarged cross-sectional view illustrating an example of part A of FIG. 1.

Referring to FIGS. 1 through 3, an electronic device module 100 according to the present embodiment includes electronic devices 1, a board 10, a molded portion 30, connection conductors 20, and external terminals 28.

The electronic devices 1 include various devices such as a passive device 1a and an active device 1b and any other type of electronic devices that may be mounted on the board.

The electronic devices 1 are mounted on one surface or on both surfaces of a board 10 to be described below. FIG. 1, by way of example, illustrates a case when both devices, the active device 1b and the passive device 1a, are mounted on an upper surface of the board 10 and only the passive device 1a is mounted on a lower surface of the board 10. However, the present example is not limited thereto. That is, the electronic devices 1 may be disposed in various forms on both surfaces of the board 10 depending on sizes or forms thereof and a design of the electronic device module 100.

The electronic devices 1 may be mounted in a flip-chip form on the board 10 or may be electrically connected to the board 10 through bonding wires 2.

Various kinds of boards (for example, a ceramic board, a printed circuit board (PCB), a flexible board, and the like) well known in the art may be used, as the board 10. In addition, the board 10 may have at least one electronic device mounted on at least one surface thereof.

The board 10 has electrodes 13 and 16 formed on one surface or both surfaces thereof. In this example, the electrodes include a plurality of mounting electrodes 13 for mounting the electronic devices 1 and a plurality of external connecting electrodes 16 to which the external terminals are electrically connected. The external connecting electrodes 16 are provided in order to be electrically connected to connection conductors 20 to be described below and are connected to the external terminals 28 through the connection conductors 20.

In addition, although not shown, the board 10 may have wiring patterns formed thereon in order to electrically connect the mounting electrodes 13 or the external connecting electrodes 16 to each other.

The board 10 according to the present embodiment described above is a multilayer board including a plurality of layers, and circuit patterns 15 for forming electrical connections are formed between the plurality of layers.

In addition, the board 10 according to the present embodiment includes conductive vias 14 electrically connecting the electrodes 13 and 16 and the circuit patterns 15 formed in the board 10 to each other.

Additionally, according to an example, the board 10 has electroplating wirings (not shown). The electroplating wirings are used in a process of forming connection conductors 20 to be described below by electroplating.

The board 10 according to the present embodiment is a board in which a plurality of identical mounting regions are repeatedly disposed in order to simultaneously manufacture a plurality of individual modules. In detail, the board 10 according to the present embodiment is a board having a rectangular shape or form with a wide area and having a long strip form. In this case, the electronic device module is manufactured for each of a plurality of individual mounting regions. However, it is to be noted that the board 10 is not limited to this shape and thus the board 10 can have other shapes and forms such as a square shape, a circular shape, a triangular shape, or any other shape suitable for its intended purpose.

The molded portion 30 includes a first molded portion 31 formed on the upper surface of the board 10 and a second molded portion 35 formed on the lower surface of the board 10.

The molded portion 30 seals the electronic devices 1 mounted on both surfaces of the board 10. In addition, the molded portion 30 is filled between the electronic devices 1 mounted on the board 10 to prevent an electrical short-circuit from occurring between the electronic devices 1. Furthermore, the molded portion 30 fixes the electronic devices 1 to the board while enclosing outer portions of the electronic devices 1, thereby safely protecting the electronic devices 1 from external impact.

The molded portion 30 according to the present example is formed of an insulating material such as an epoxy molding compound (EMC), including a resin material such as epoxy, or the like, but is not limited thereto.

In one example, the first molded portion 31 is formed in a shape in which the entire one surface of the board 10 is covered. In addition, the case in which all of the electronic devices 1 are embedded in the first molded portion 31 has been described by way of example in the present embodiment. However, the present example is not limited thereto, but may be variously applied. For example, at least one of the electronic devices 1 embedded in the first molded portion 31 may be configured so as to be partially exposed to the outside of the first molded portion 31.

The second molded portion 35 is formed on the lower surface of the board 10 and includes the connection conductors 20 formed therein.

The second molded portion 35 is formed in a manner in which it embeds all of the electronic devices 1 therein, similar to the first molded portion 31. However, the second molded portion 35 is also formed of a shape in which some of the electronic devices 1 are exposed to the outside.

The connection conductors 20 are disposed in a form in which they are bonded to at least one surface of the board 10, and have one end bonded to the board 10 and the other end exposed to the outside of the molded portion 30 to thereby be connected to the external terminals 28. Therefore, the connection conductors 20 are formed in the molded portion 30 in a shape in which they penetrate through the molded portion 30.

The connection conductor 20 is formed of a conductive material, for example, copper, gold, silver, aluminum, or an ally thereof.

The connection conductor 20 according to the present embodiment is formed in a shape similar to a conical shape in which a horizontal cross-sectional area thereof becomes small toward one end thereof, that is, toward the board 10. However, the shape of the connection conductor 20 is not limited thereto, but may be variously changed as long as a horizontal cross-sectional area of the connection conductor 20 in a portion close to the board 10 is smaller than that of the connection conductor 20 in a portion close to an outer surface of the molded portion 30.

The other end of the connection conductor 20 is formed in a flat shape in which it is in parallel with the board 10, as shown in FIG. 3. However, the other end of the connection conductor 20 is not limited thereto, but may also be formed in a shape in which it is concave inwardly or protrudes so as to be convex outwardly.

In addition, the other end of the connection conductor 20 is disposed on the same plane as an outer surface of the second molded portion 35. However, the other end of the connection conductor 20 is not limited thereto, but may be implemented so as to be disposed in the second molded portion 35 as in another embodiment to be described.

The connection conductor 20 includes the external terminal 28 bonded to the other end thereof. The external terminal 28 electrically and physically connects the electronic device module 100 and a main board (not shown) on which the electronic device module 100 is mounted. The external terminal 28 is formed in a pad form, but is not limited thereto. That is, the external terminal 28 is formed in various forms such as a bump form, a solder ball form, and the like.

The present embodiment describes, the case in which the connection conductors 20 are formed in only the second molded portion 35. However, the present example is not limited thereto. That is, the connection conductors 20 may also be formed in the first molded portion 31, if necessary.

The electronic device module 100 according to the present embodiment configured as described above further includes an insulating layer 17 formed on a surface of the board 10, as shown in FIG. 3. The insulating layer 17 is formed on one surface or both surfaces of the board 10 and protects wiring patterns (not shown) formed on the board 10 while covering the wiring patterns.

In addition, the insulating layer 17 partially covers the electrodes 13 and 16 formed on the board 10. In more detail, the insulating layer 17 covers a remaining portion of the external connecting electrode 16 according to the present embodiment that is not bonded to the connection conductor 20. Therefore, the connection conductor 20 is configured to contact the insulating layer 17 at a portion at which it is bonded to the external connecting electrode 16.

This configuration is implemented by allowing the insulating layer 17 to completely cover the external connecting electrode 16 in a process of manufacturing the board 10, forming the molded portion 30 thereon, removing the molded portion 30 and the insulating layer 17 at a portion to which the connection conductor 20 is bonded, and then forming the connection conductor 20. This will be described in more detail in the following description for a manufacturing method.

Next, a manufacturing method of an electronic device module according to an example will be described.

FIGS. 4A through 4H are cross-sectional views illustrating an example of a manufacturing method of the electronic device module shown in FIG. 1.

Figure 4A:
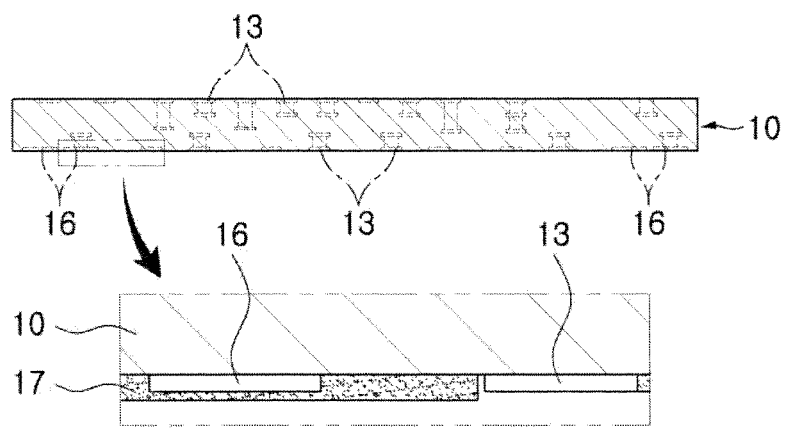
FIGS. 4A through 4H are cross-sectional views illustrating an example of a manufacturing method of the electronic device module shown in FIG. 1.

Referring to FIGS. 4A through 4H, as shown in FIG. 4A, an operation of preparing the board 10 is performed. As described above, the board 10 is a multilayer board, and includes the mounting electrodes 13 formed on both surfaces thereof. However, the mounting electrodes 13 are not limited thereto and the mounting electrodes 13 may be disposed on only one of the surfaces of the board 10. In addition, the board 10 includes the external connecting electrodes 16 formed on the lower surface thereof. However, it is noted that this feature is not limited thereto and thus the external connecting electrodes 16 may be formed on the upper surface of the board 10 or any other suitable surface of the board 10.

In addition, the board 10 according to the present embodiment includes the insulating layer 17 formed on one surface or both surfaces thereof. The insulating layer 17 is formed while covering the wiring patterns formed on the board 10, as described above. In addition, the electrodes 13 and 16 are completely embedded in the insulating layer 17 or are exposed. Further, the exposed electrodes 13 or 16 are entirely or partially exposed.

In detail, in the board 10 according to the present embodiment, the mounting electrode 13 is configured so as to be entirely exposed, and the external connecting electrode 16 is configured in a form in which it is entirely covered by the insulating layer 17 to thereby be completely buried in the insulating layer 17.

Figure 4B:
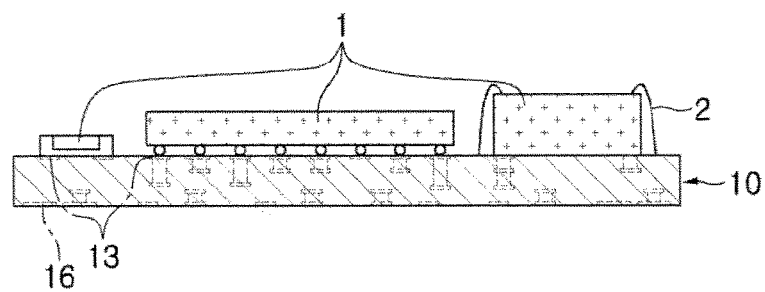

Then, as shown in FIG. 4B, an operation of mounting the electronic devices 1 on one surface, that is, the upper surface, of the board 10 is performed. The present operation is performed by printing solder pastes on the mounting electrodes 13 formed on one surface of the board 10 in a screen printing scheme, or the like, seating the electronic devices 1 on the solder pastes, and then applying heat by a reflow process to melt and harden the solder pastes.

However, the present operation is not limited thereto, but may be performed by seating the electronic devices 1 on one surface of the board 10 and then electrically connecting the mounting electrodes 13 formed on the board 10 and electrodes of the electronic devices 1 using the bonding wires 2.

Meanwhile, in this process, when the external connecting electrode 16 of the board 10 is not covered by the insulating layer 17, but is exposed like the mounting electrode 13, an exposed portion of the external connecting electrode 16 is easily oxidized by the heat applied thereto in the reflow process.

However, in the manufacturing method according to the present embodiment, since the board 10 of which the external connecting electrode 16 is entirely covered with the insulating layer 17 is used, occurrences of this problem are prevented.

Figure 4C:
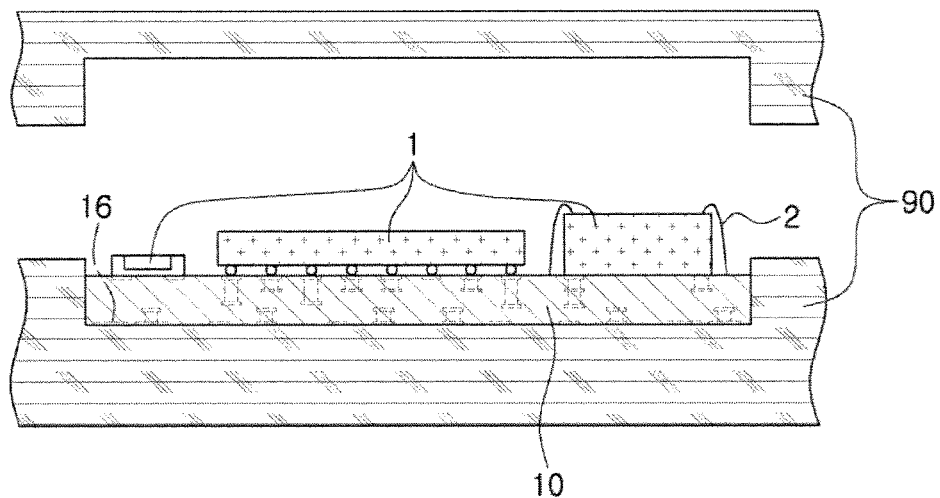

Then, an operation of forming the first molded portion 31 on one surface of the board 10 is performed. In the present operation, as shown in FIG. 4C, the board 10 on which the electronic devices 1 are mounted is first disposed in a mold 90.

Figure 4D:
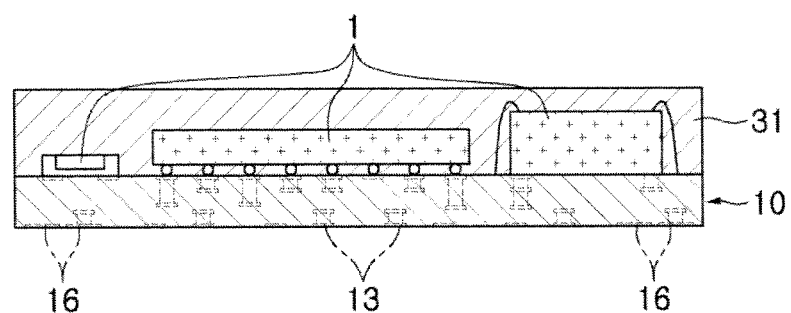

Then, a molding resin is injected into the mold 90 to form the first molded portion 31 as shown in FIG. 4D. Therefore, the electronic devices 1 mounted on one surface, that is, the upper surface, of the board 10 are protected from the outside by the first molded portion 31.

Figure 4E:
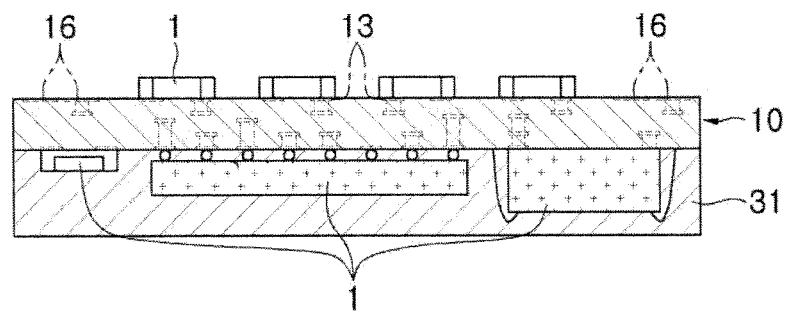

Then, as shown in FIG. 4E, an operation of mounting the electronic devices 1 on the lower surface of the board 10 is performed. The present operation is performed by printing solder pastes on the mounting electrodes 13 in a screen printing scheme, or the like, seating the electronic devices 1 on the solder pastes, and then applying heat by a reflow process to melt and harden the solder pastes.

Meanwhile, as described above, in the board 10 according to the present embodiment, since the external connecting electrode 16 is entirely embedded in the insulating layer 17 to thereby be protected by the insulating layer 17, oxidation of the external connecting electrode 16 is also prevented in this process.

Figure 4F:
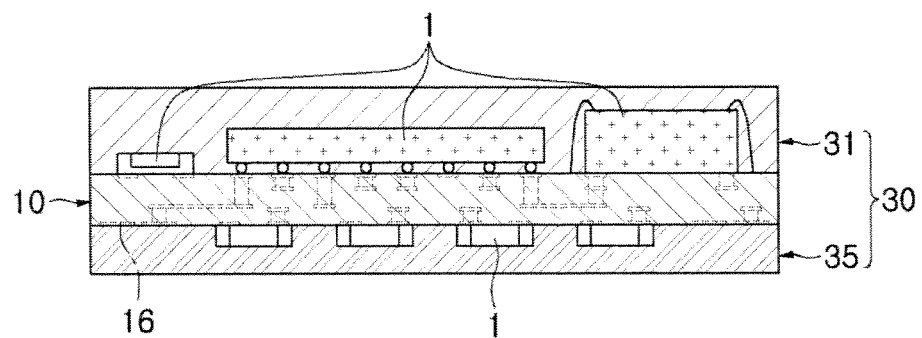

Next, as shown in FIG. 4F, an operation of forming the second molded portion 35 beneath the board 10 is performed. The present operation is performed by disposing the board 10 in the mold 90 and then injecting a molding resin into the mold 90, similar to the case shown in FIG. 4C.

Then, an operation of forming the connection conductors 20 is performed.

Figure 4G:
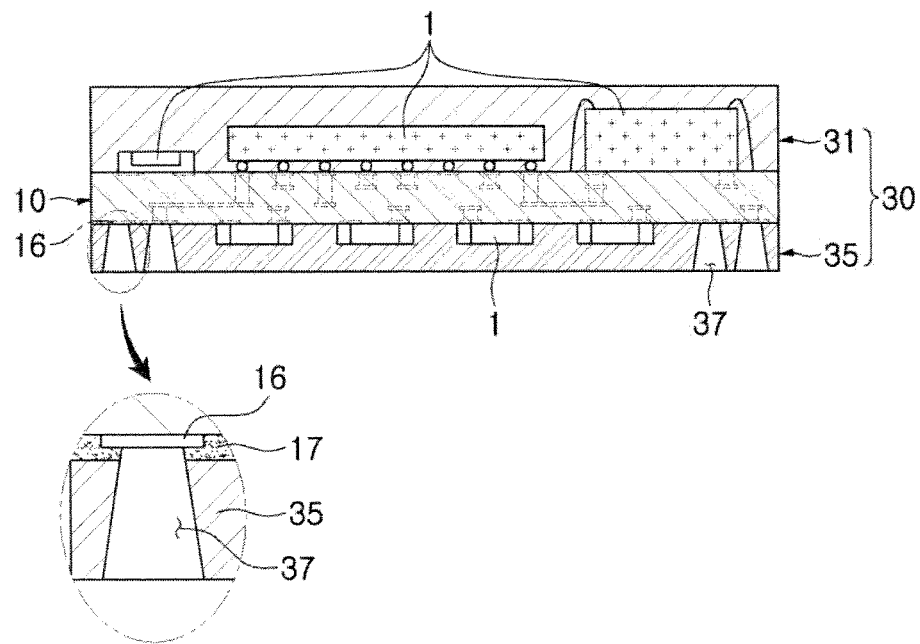

As shown in FIG. 4G, via holes 37 are formed in the second molded portion 35. The via holes 37 are formed using a laser drill.

In an example, the via hole 37 has a conical shape in which a horizontal cross-sectional area of the via hole 37 becomes smaller toward the board 10. However, this is only an example and the via hole 37 may have a different shape. For example, via hole 37 may have a cylindrical shape.

In addition, the via holes 37 are formed, such that portions of the insulating layer 17 formed on the board are removed together with the molded portion 35. That is, the via holes 37 are formed so as to expose the external connecting electrodes 16 while penetrating through both of the second molded portion 35 and the insulating layer 17.

Figure 4H:
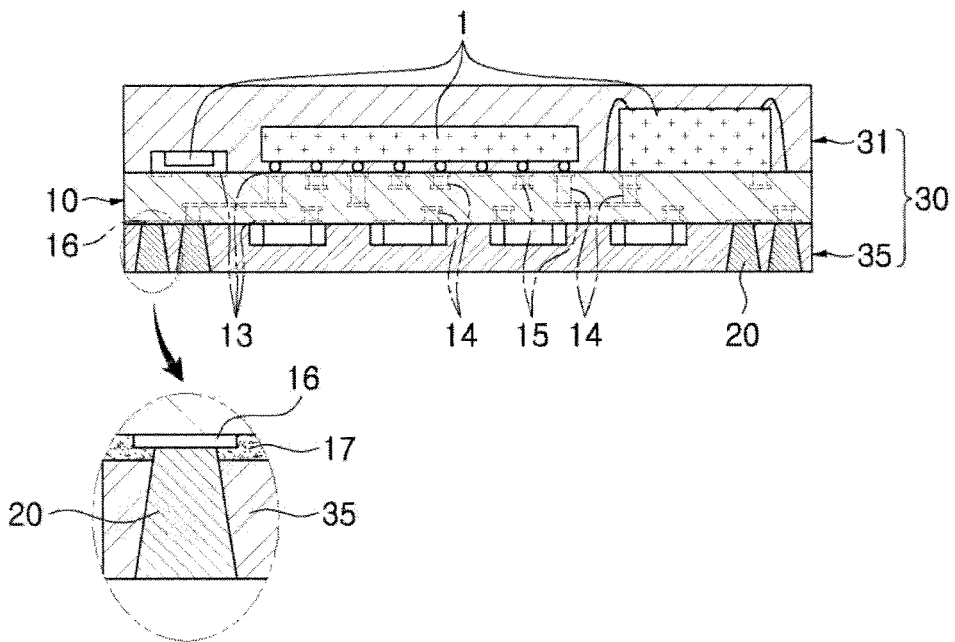

Then, the via holes 37 are filled or applied with conductive materials to form the connection conductors 20 as shown in FIG. 4H.

Particularly, the connection conductor 20 according to the present embodiment is formed by a plating process. In this case, since the connection conductor 20 is formed of copper, copper plating is performed. However, the platting process is not limited thereto and if the connection conductor 20 is formed of another conductive material, for example, gold, silver, aluminum, or an ally thereof, a respective platting process is performed.

In one aspect, the plating process is configured of only electroplating. In this case, the via holes 37 are sequentially filled from the external electrode terminals 16 of the board 10 using electroplating wirings (not shown) formed on the board 10 to form the connection conductors 20. However, the present example is not limited thereto. That is, electroless plating may also be used, if necessary.

Meanwhile, since the connection conductor 20 according to the present embodiment is formed on a surface of the EMC, metal bonding is not easy. To this end, in the manufacturing method according to the present embodiment, a mechanical interlocking, hooking, and anchoring theory is used by significantly increasing a roughness of an inner surface in a process of forming the via holes 37. Therefore, even though the molded portion is formed of the EMC, heterogeneous interfaces of the inner surface of the via hole 37 and the connection conductor 20 are easily bonded to each other.

Meanwhile, various modifications may be made. For example, substantial copper plating may be performed after a catalyst metal such as gold, platinum, palladium, or the like, is disposed in a plating target region in order to increase coupling force between the connection conductor 20 and the molded portion 30.

In addition, the present example is not limited to the above-mentioned method, but may be variously modified. For example, after the connection conductors 20 are partially formed in the via holes 37 in a plating scheme, conductive pastes are applied in a screen printing scheme to form the connection conductors 20 while completely filling the via holes 37.

When the connection conductors 20 are formed by the process as described above, the external terminals 28 are formed at the other ends of the connection conductors 20 to complete the electronic device module 100 according to the present embodiment shown in FIG. 1.

Here, the external terminals 28 are formed to have various forms such as a bump form, a solder ball form, or the like, rather than a pad form.

In the electronic device module 100 according to the present embodiment manufactured through the above-mentioned operations, the electronic devices 1 are mounted on both surfaces of the board 10 and are sealed by the molded portion 30. Therefore, many devices are mounted in one electronic device module 100 and are easily protected from the outside.

In addition, the connection conductors 20 are formed in the molded portion 30 in the plating scheme and are connected to the external terminals 28. Therefore, conductor paths and circuit wirings connecting the board 10 to the outside are very easily implemented even in a double-sided molding structure, simplifying the manufacturing of the electronic device module.

Meanwhile, according to the related art, in the case in which the external terminal is formed directly on the external connecting electrode 16 formed of copper (Cu), after an exposed surface of the external connecting electrode 16 is plated with nickel (Ni) or gold (Au) to form an under bump metallurgy (UBM), the external terminal 28 is bonded onto the UBM.

This is to prevent the copper, exposed to the outside, from being oxidized due to heat applied to the external connecting electrode in a manufacturing process such as a reflow process, or the like.

However, in the manufacturing method of an electronic device module according to the present embodiment, the external terminal 28 is not formed directly on the board 10, but is formed on the molded portion 30 formed on one surface of the board 10.

In more detail, after the molded portion 30 is formed in a state in which the insulating layers 17 are formed on the external connecting electrodes 16 of the board 10, the insulating layer 17 is removed while forming the via holes 37 in the molded portion 30, and the connection conductors 20 are formed in the plating scheme.

Therefore, since a time in which the external connecting electrodes 16 are exposed to the outside is short and high heat due to the reflow process, or the like, is not applied to the external connecting electrodes 16, even though the UBM is not formed, oxidation of the external connecting electrodes 16 is suppressed. In addition, since the UBM is not formed, the electronic device module is easily manufactured.

In addition, due to the manufacturing method as described above, in the electronic device module 100 according to the present embodiment, the connection conductor 20 formed of copper is directly bonded to the external connecting electrode 16 formed of copper. That is, the external connecting electrode 16 and the connection conductor 20 according to the present embodiment are formed integrally with each other by the same metal (for example, copper) without a heterogeneous kind of metal such as the UBM interposed on a bonded surface therebetween.

Therefore, since an interface by the heterogeneous kind of metal is not present between the external connecting electrode 16 and the connection conductor 20, reliability of bonding between the external connecting electrode 16 and the connection conductor 20 is secured.

Meanwhile, although the case in which the second molded portion 35 is formed after the first molded portion 31 is formed has been described by way of example in the present example, the present example is not limited thereto, but may be variously applied. For example, the second molded portion 35 may first be formed, or the first and second molded portions 31 and 35 may be simultaneously formed.

Figure 5:
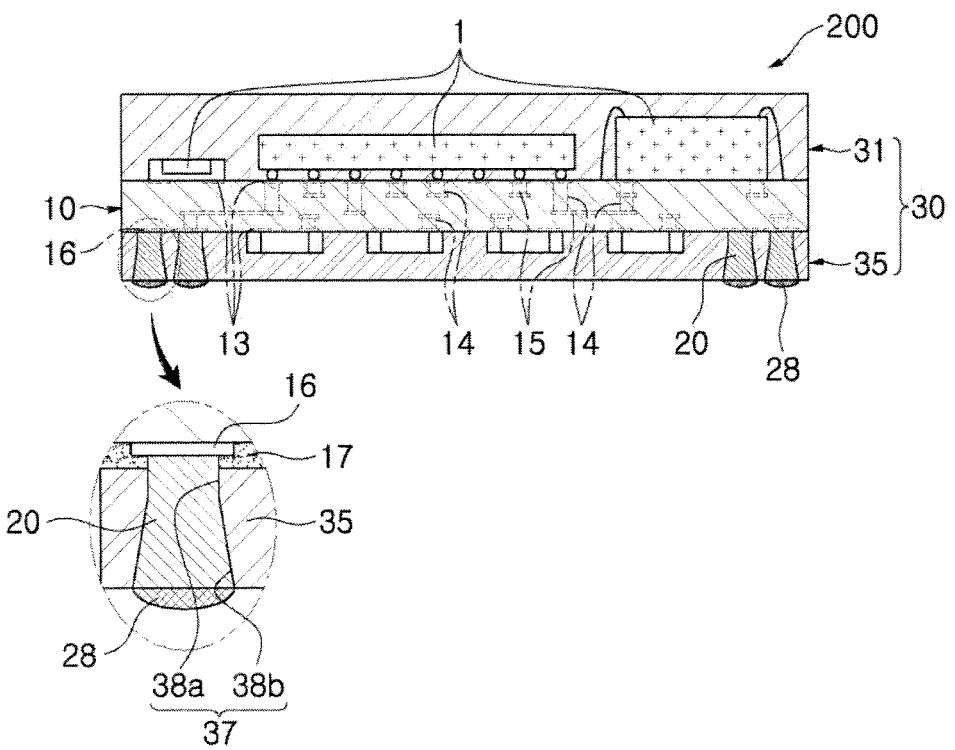
FIGS. 5 through 9 are cross-sectional views schematically illustrating examples of electronic device modules.

FIG. 5 is a cross-sectional view schematically illustrating a connection conductor of an electronic device module according to another example.

Referring to FIG. 5, in an electronic device module 200 according to the present embodiment, an inner surface of the via hole 37 is divided into a plurality of inclined sections 38a and 38b. That is, the via hole 37 according to the present embodiment is configured so that the inner surface thereof has a plurality of inclined angles.

In the case of the via hole 37 according to the present embodiment, a portion close to the external connecting electrode 16 is formed as a first inclined section 38a in which a cross-sectional area of the via hole 37 is gently increased (or decreased), and a portion close to the external terminal 28 is formed as a second inclined section 38b in which a cross-sectional area of the via hole 37 is more rapidly increased (or decreased) as compared with the first inclined section 38a.

Therefore, in the case of an inclined angle formed by one surface of the board 10 and an outer surface of the connection conductor 20, an inclined angle with the first inclined section 38a is larger than that with the second inclined section 38b.

Here, in the case in which the second inclined section 38b is formed at the same inclined angle as that of the connection conductor 20 (See FIG. 1) according to the above-mentioned embodiment, an area of a bonded surface on which the connection conductor 20 and the external connecting electrode 16 are bonded to each other is increased by the first inclined section 38a.

Therefore, in the case in which the via hole 37 is formed so as to have the plurality of inclined sections 38a and 38b having different inclined angles as in the present embodiment, the area of the bonded surface between the connection conductor 20 and the external connecting electrode 16 is increased without changing sizes of the external terminals 28 and a distance between the external terminals 28, such that reliability of bonding between the connection conductor 20 and the external connecting electrode 16 is increased.

Figure 6:
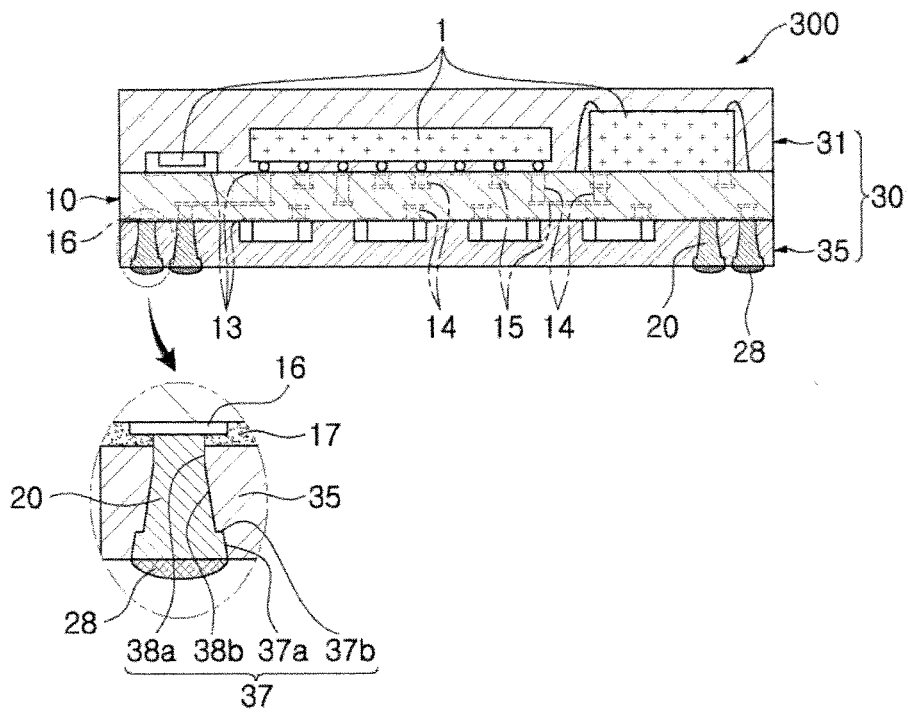

FIG. 6 is a cross-sectional view schematically illustrating a connection conductor of an electronic device module according to another example.

Referring to FIG. 6, in an electronic device module 300 according to an example, an inner surface of the via hole 37 includes a plurality of inclined sections 38a and 38b, similar to FIG. 5, and further include at least one steps 37a and 37b formed in a step form.

Although described, by way of example, is the case in which the steps 37a and 37b are formed at a portion of the via hole 37 close to the external terminal 28, the present example is not limited thereto. That is, a plurality of steps may be formed at various positions in the via hole 37.

The via hole 37 includes a sidewall 37a disposed in an approximately vertical direction and at least one horizontal extension surface 37b disposed in a direction in which it increases or decreases a horizontal cross-sectional area from the sidewall 37a, by the steps 37a and 37b.

The structure of the via hole 37 as described above may be to further secure mechanical anchoring force between a plating material formed in a process of forming a connection conductor 20 to be described below and the via hole 37.

The molded portion 30 according to the present embodiment is formed of the EMC. Generally, it has been known that it is not easy to perform plating on a surface of the EMC, which is a thermosetting resin, that is, to bond a metal to the surface of the EMC.

Therefore, in the manufacturing method according to the present embodiment, a mechanical interlocking, hooking, and anchoring theory or an anchoring effect is used in order to plate a conductor on the surface of the EMC. The mechanical interlocking, hooking, and anchoring theory refers to a theory in which an adhesive permeates into an irregular structure (ruggedness) of a surface of a material to be adhered to thereby be bonded thereto by mechanical engagement.

That is, in the manufacturing method according to the present embodiment, a method of forming the inner surface of the via hole 37 formed of the EMC as roughly as possible and coupling the plating material to the inner surface of the via hole 37 by the anchoring effect in the plating process is used.

To this end, in the present embodiment, a surface roughness of the inner surface of the via hole 37 is increased as much as possible in a process of forming the via hole 37 using laser to form an irregular structure. Here, the surface roughness is increased by adjusting a kind of laser, a size of a spot of the laser, a power of the laser. However, other processes may be used to increase the surface roughness of the inner surface of the via hole 37 such as a chemical process.

The horizontal extension surface 37b is formed of a surface perpendicular to a direction in which the laser is irradiated, but is not limited thereto. That is, the horizontal extension surface 37b is also formed of a gentle inclined surface. Therefore, the horizontal extension surface 37b according to the present embodiment is defined as a surface formed at an angle closer to a right angle to the direction in which the laser is irradiated as compared with the sidewall 37a.

Since the horizontal extension surface 37b is irradiated with a spot of the laser at a wide area, it increases the roughness of the inner surface of the via hole 37. Therefore, the connection conductor 20 is more firmly anchored to the via hole 37 by the horizontal extension surface.

Meanwhile, in the case of obtaining an optimal roughness by only the laser, an etching process is also additionally performed. That is, various applications are made. For example, an etchant is injected into the via hole 37 and then removed after a predetermined time, thereby increasing the roughness.

Figure 7:
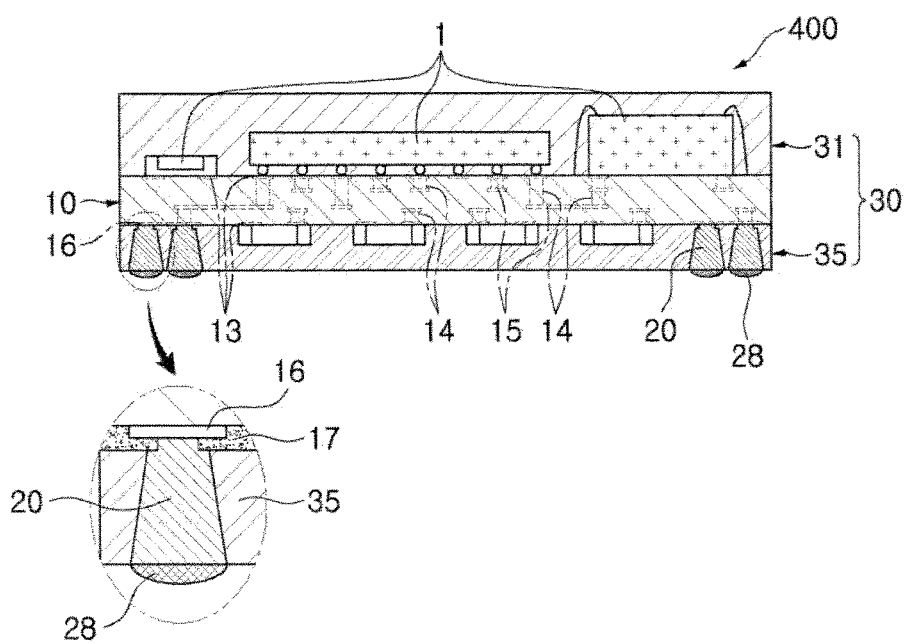

FIG. 7 is a cross-sectional view schematically illustrating a connection conductor of an electronic device module according to another example.

Referring to FIG. 7, in an electronic device module 400 according to another example, an insulating layer 17 in the via hole is not entirely removed, but is partially removed. Therefore, the insulating layer 17 partially remains in the via hole, and is partially interposed particularly between the external connecting electrode 16 and the connection conductor 20.

Figure 8:
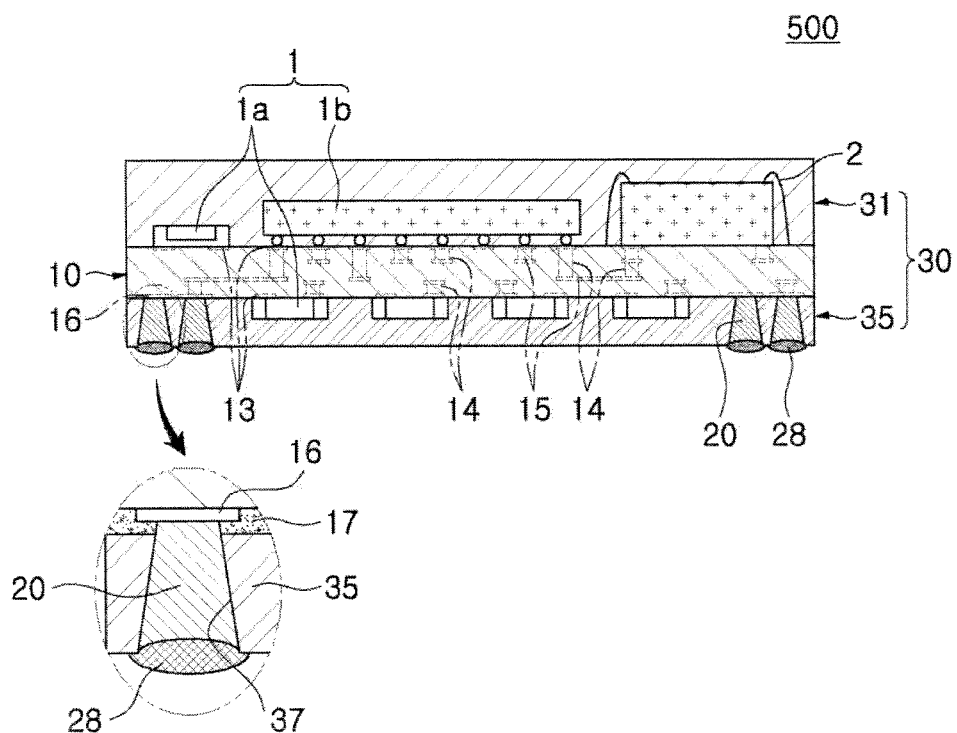

FIG. 8 is a cross-sectional view schematically illustrating an electronic device module according to another example.

Referring to FIG. 8, in an electronic device module 500 according to another example, a connection conductor 20 is not completely filled in the via hole 37, but is configured so as to be filled in only a portion of the via hole 37. In addition, a portion of the external terminal 28 is inserted into the via hole 37 to thereby fill the remaining space. It is also noted that although FIG. 8, illustrates the via hole 37 having a conical shape as that illustrated in FIGS. 1 and 4H as being partially filled, the other via holes as those illustrated in FIGS. 5, 6, and 7 may also be partially filled.

In this case, since the portion of the external terminal 28 is inserted into the via hole 37 in a protrusion form, a coupling force between the external terminal 28 and the connection conductor 20 or the molded portion 35 is increased.

Figure 9:
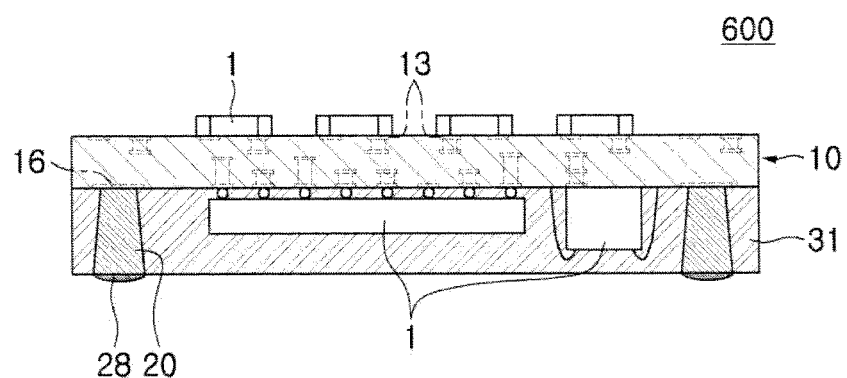

FIG. 9 is a cross-sectional view schematically illustrating an electronic device module according to another example.

Referring to FIG. 9, an electronic device module 600 according to another example is similar to the electronic device module 100 shown in FIG. 1 and is different from the electronic device module 100 in that the molded portion 31 is formed on only one surface of the board 10. In this case, since only one molded portion 31 is formed, manufacturing processes and a manufacturing cost may be decreased.

As set forth above, in the electronic device module according to the present example, the electronic devices are mounted on both surfaces of the board and are sealed by the molded portion. Therefore, many devices are mounted in one electronic device module and are easily protected from the outside.

In addition, the connection conductors are formed in the via holes formed in the molded portion in the plating scheme. Therefore, the conductor paths connecting the board and the outside to each other are very easily implemented even in the double-sided molding structure, such that the electronic device module is easily manufactured.

In addition, after the molded portion is formed in the state in which the external connecting electrodes are covered with the insulating layer, the insulating layer is removed while forming the via holes in the molded portion, and the connection conductors are formed in the plating scheme.

Therefore, since the time in which the external connecting electrodes are exposed to the outside is short and the high heat is not applied to the external connecting electrodes, even though the UBM is not formed as in the related art, the oxidation of the external connecting electrodes is suppressed. In addition, since the UBM is not formed, the electronic device module is easily manufactured.

Further, due to the manufacturing method as described above, in the electronic device module according to the present embodiment, the connection conductor formed of the copper is directly bonded to the external connecting electrode formed of the copper, such that reliability of bonding between the external connecting electrode and the connection conductor is secured.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device module comprising:
a board including external connecting electrodes and mounting electrodes;
an electronic device mounted on the mounting electrodes;
a molded portion sealing the electronic device;
connection conductors each having an end bonded to a respective external connecting electrode and penetrating through the molded portion to an opposite end thereof having an external terminal bonded thereto; and
an insulating layer disposed between the board and the molded portion,
wherein the insulating layer covers the external connecting electrodes, surrounds the connection conductors adjacent to where the connection conductors are bonded to the external connection electrodes, and abuts stepped profile surfaces of the connection conductors.

2. The electronic device module of claim 1, wherein the connection conductors are in a shape in which a cross-sectional area thereof decreases as the connection conductors approach the external connecting electrodes.

3. The electronic device module of claim 1, wherein each of the connection conductors includes a first inclined section and a second inclined section, wherein the first inclined section comprises a cross sectional area smaller than a cross sectional area of the second inclined section.

4. The electronic device module of claim 3, wherein the first inclined section is disposed at a portion close to the respective external connecting electrodes, and the second inclined section is disposed at a portion close to the respective external terminals.

5. The electronic device module of claim 1, wherein the connection conductors include at least one step.

6. The electronic device module of claim 1, wherein the opposite ends of the connection conductors are disposed in the molded portion, and the external terminals are partially filled in the molded portion to bond to the connection conductors.

7. The electronic device module of claim 1, wherein the molded portion includes an epoxy molding compound (EMC).

8. The electronic device module of claim 1, wherein the connection conductors are disposed in the molded portion.

9. An electronic device module comprising:
a board comprising electrodes and an insulating layer disposed on a surface thereof;
a molded portion sealing the surface of the board; and
connection conductors bonded to respective electrodes while penetrating through the molded portion and the insulating layer, and configured to contact the molded portion and the insulating layer,
wherein the insulating layer covers the electrodes, surrounds the connection conductors adjacent to where the connection conductors are bonded to the electrodes, and abuts stepped profile surfaces of the connection conductors.

10. The electronic device of claim 9, wherein the insulating layer fully covers the electrodes outside of where they are bonded to the connection conductors.

11. An electronic device module comprising:
a board including external connecting electrodes and mounting electrodes;
an electronic device mounted on the mounting electrodes;
an insulating layer sealing the board; and
connection conductors disposed within the insulating layer, bonded to the external connecting electrodes and extending to an outside of the electronic device module,
wherein the insulating layer surrounds the connection conductors, covers the external connecting electrodes adjacent to where the connection conductors are bonded to the external connecting electrodes, and abuts stewed profile surfaces of the connection conductors.

12. The electronic device module of claim 11, wherein the insulating layer fully covers the external connecting electrodes outside of where they meet the connection conductors.

13. The electronic device module of claim 11, wherein each of the connection conductors includes a first inclined section and a second inclined section, wherein the first inclined section comprises a cross sectional area smaller than a cross sectional area of the second inclined section.

14. The electronic device module of claim 1, wherein portions of the insulating layer are inserted into grooves of the stepped profile surfaces, respectively.

15. The electronic device module of claim 1, wherein grooves of the stepped profile surfaces are formed at distal ends to where the connection conductors are bonded to the external connection electrodes, respectively.

16. The electronic device module of claim 9, wherein portions of the insulating layer are inserted into grooves of the stepped profile surfaces, respectively.

17. The electronic device module of claim 9, wherein grooves of the stepped profile surfaces are formed at distal ends to where the connection conductors are bonded to the external connection electrodes, respectively.

* * * * *